United States Patent
You et al.

(10) Patent No.: US 10,277,123 B2
(45) Date of Patent: Apr. 30, 2019

(54) METHOD AND APPARATUS FOR SETTING CONTROL LOOP PARAMETERS OF A VOLTAGE REGULATOR CONTROLLER

(71) Applicant: Infineon Technologies Austria AG, Villach (AT)

(72) Inventors: Zhiqing You, Torrance, CA (US); Tim Ng, Monterey Park, CA (US); Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/429,771

(22) Filed: Feb. 10, 2017

(65) Prior Publication Data
US 2018/0234012 A1    Aug. 16, 2018

(51) Int. Cl.
| | |
|---|---|
| H02M 3/158 | (2006.01) |
| H02M 3/156 | (2006.01) |
| G01R 19/25 | (2006.01) |
| G01R 23/02 | (2006.01) |
| G06F 17/50 | (2006.01) |
| H02M 1/084 | (2006.01) |

(52) U.S. Cl.
CPC ........ *H02M 3/156* (2013.01); *G01R 19/2513* (2013.01); *G01R 23/02* (2013.01); *G06F 17/5009* (2013.01); *H02M 1/084* (2013.01); *H02M 3/1584* (2013.01)

(58) Field of Classification Search
CPC .... H02M 3/1584; H02M 3/156; H02M 3/157; H02M 1/084; H02M 1/0845
USPC .......................................... 323/272, 282–286
See application file for complete search history.

(56) References Cited

U.S. PATENT DOCUMENTS

| | | | | |
|---|---|---|---|---|
| 7,659,701 | B1 * | 2/2010 | Metsker | H02M 3/156 323/266 |
| 2004/0217741 | A1 * | 11/2004 | Muratov | H02M 3/1584 323/219 |
| 2005/0007087 | A1 * | 1/2005 | Pullen | H02M 3/156 323/283 |
| 2006/0208717 | A1 * | 9/2006 | Shimizu | H02M 3/157 323/284 |
| 2007/0247129 | A1 * | 10/2007 | Jacobs | H02M 3/157 323/282 |
| 2009/0284235 | A1 * | 11/2009 | Weng | H02M 3/156 323/222 |

(Continued)

FOREIGN PATENT DOCUMENTS

JP    WO 2011111720 A1 *    9/2011    ............ H02M 3/156

*Primary Examiner* — Alex Torres-Rivera
(74) *Attorney, Agent, or Firm* — Murphy, Bilak & Homiller, PLLC (57) ABSTRACT

A method is provided for configuring a controller for a voltage regulator system having an output filter response set by an inductance (L) and a capacitance (C). The method includes applying one or more pulses of known on-time and off-time to the voltage regulator system, and taking measurements of the voltage regulator system in response to the one or more pulses of known on-time and off-time. The method further includes constructing a model of the output filter response of the voltage regulator system based on the measurements, and setting one or more control loop parameters of the controller based on the model of the output filter response.

26 Claims, 5 Drawing Sheets

(56) References Cited

U.S. PATENT DOCUMENTS

| | | | | |
|---|---|---|---|---|
| 2011/0109284 A1* | 5/2011 | Houston | ............ | H02M 3/1584 |
| | | | | 323/272 |
| 2014/0306680 A1* | 10/2014 | Liu | ........................ | G05F 1/468 |
| | | | | 323/288 |
| 2015/0288285 A1* | 10/2015 | Paul | ................... | H02M 3/1584 |
| | | | | 323/271 |
| 2016/0013719 A1* | 1/2016 | Babazadeh | .......... | H02M 3/157 |
| | | | | 323/271 |

\* cited by examiner

METHOD AND APPARATUS FOR SETTING CONTROL LOOP PARAMETERS OF A VOLTAGE REGULATOR CONTROLLER

TECHNICAL FIELD

The present application relates to voltage regulators, in particular setting control loop parameters of a voltage regulator controller.

BACKGROUND

PID (proportional-integral-derivative) controllers are widely used for controlling voltage regulators. Many types of voltage regulators have an output filter response set by an actual or equivalent effective output inductance (L) and capacitance (C) of the system. Output capacitance and inductance variations can cause the voltage regulator system to become unstable, shutdown or malfunction. The double pole frequency of the output filter response, which is a function of output inductance and capacitance as given by $1/(2\pi\sqrt{LC})$, is a key parameter in optimizing PID compensation for the control loop of a voltage regulator controller. If the actual output inductance and/or capacitance of a voltage regulator system varies from an expected or nominal value e.g. due to device variation, device aging, modular load applications, etc., the double pole frequency shifts as well. The initial optimized PID control loop, which is conventionally set based on a baseline (nominal) double pole frequency, often cannot compensate for variations in the actual double pole frequency, resulting in undesirable system behaviour.

For some voltage regulator system applications, the output inductance and capacitance can vary by up to +/−22%. Such LC variation means the double pole frequency can vary from −18% to 28%. For modular load applications, where the user can modify the regulator loading by plugging in additional loads and output capacitance, the capacitance and LC variation can be even larger. Conventional approaches for compensating against a wide range of variation in the double pole frequency include adding excessive amount of output capacitors, which increases system cost and requires excessive charging current during power up. Another conventional approach uses very conservative PID compensation, causing excessive overshoot or undershoot for systems with less capacitance or larger inductance than expected. Hence, there is a need for improved output filter response compensation techniques.

SUMMARY

According to an embodiment of a method of configuring a controller for a voltage regulator system having an output filter response set by an inductance (L) and a capacitance (C), the method comprises: applying one or more pulses of known on-time and off-time to the voltage regulator system; taking measurements of the voltage regulator system in response to the one or more pulses of known on-time and off-time; constructing a model of the output filter response of the voltage regulator system based on the measurements; and setting one or more control loop parameters of the controller based on the model of the output filter response.

According to an embodiment of a voltage regulator system having an output filter response set by an inductance (L) and a capacitance (C), the voltage regulator system comprises a controller operable to apply one or more pulses of known on-time and off-time to the voltage regulator system, take measurements of the voltage regulator system in response to the one or more pulses of known on-time and off-time, construct a model of the output filter response of the voltage regulator system based on the measurements, and set one or more control loop parameters of the controller based on the model of the output filter response.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide techniques for measuring the output filter response of a voltage regulator system and setting one or more control parameters for the voltage regulator system based on a model of the output filter response derived from the measurements. This way, variation in the output inductance (L) and capacitance (C), which set the output filter response of the voltage regulator system, can be measured and accounted for in setting the control loop parameter(s) of the controller used to control operation of the voltage regulator system.

Figure 1:
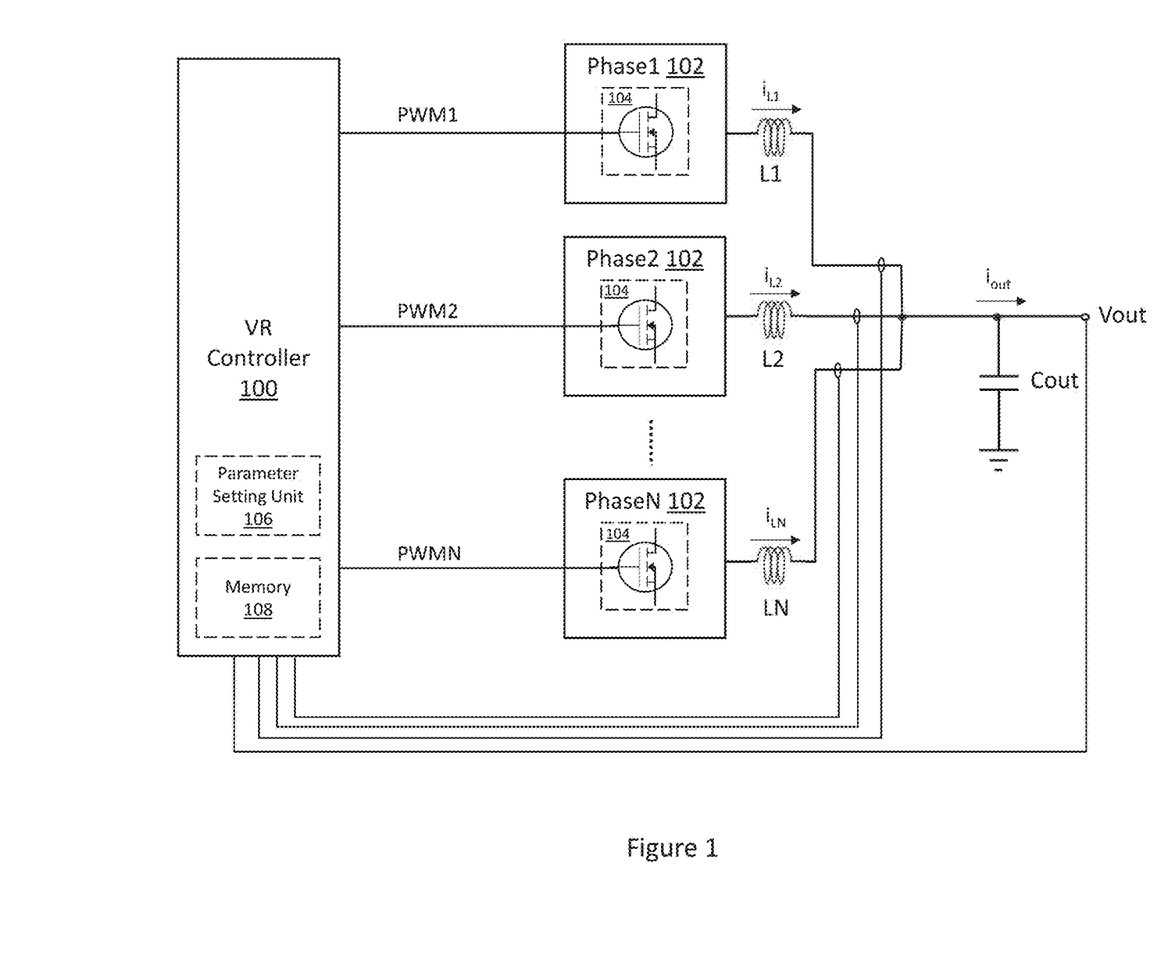
FIG. 1 illustrates a block diagram of an embodiment of a voltage regulator having a control loop parameter setting unit.

FIG. 1 illustrates an embodiment of a controller 100 for a voltage regulator (VR). Any voltage regulator that has an output filter response set by an inductance (L) and a capacitance (C) can be used. For example, the voltage regulator can be a non-isolated (no transformer) or isolated (with transformer) DC-to-DC converter such as a buck converter, boost converter, buck-boost converter, Ćuk converter, forward converter, half bridge converter, full bridge converter, flyback converter, etc., or an AC-to-DC converter such as a single-phase/half-wave rectifier, single-phase/full-wave rectifier, multi-phase/half-wave rectifier, multi-phase/full-wave rectifier, etc. The voltage regulator can have one (single) or multiple (multi) phases 102. Multi-phase voltage regulators have more than one phase 102 for powering a load (not shown). The generic voltage converter shown in FIG. 1 is illustrated with N phases 102 where N≥1. Each phase 102 includes one or ore semiconductor switch devices 104 for enabling voltage regulation for the load. Each phase 102 also includes an output inductor (Lx) for connecting the phase 102 to an output capacitor (Cout) of the voltage regulator system. As used herein, the term "inductance" refers to the inductance of one phase 102 in a single-phase voltage regulator system or the equivalent inductance of a plurality of phases 102 in a multi-phase system.

The voltage regulator controller 100 shown in FIG. 1 includes a parameter setting unit 106 for implementing the output filter response measuring and control loop parameter setting techniques described herein, and memory 108 for storing control loop parameters and telemetry data measured and used by the controller 100. In one embodiment, the controller 100 is a digital controller and operation of the parameter setting unit 106 is implemented at least partly via firmware within the controller 100. According to this embodiment, the controller 100 is specifically programmed to implement the output filter response measuring and control loop parameter setting techniques described herein. In other embodiments, the parameter setting unit 106 can be implemented as a dedicated circuit included in or associated with the controller 100.

Figure 2:
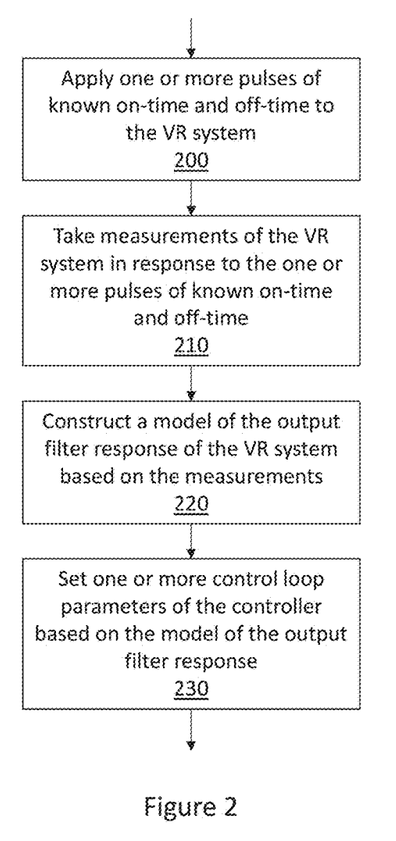
FIG. 2 illustrates a flow diagram of an embodiment of a control loop parameter setting method for a voltage regulator.

FIG. 2 illustrates an embodiment of a method of measuring the output filter response of the voltage regulator system and setting one or more control loop parameters of the controller 100 based on a model of the output filter response derived from the measurements, as implemented by the parameter setting unit 106. The method includes applying one or more pulses (PWMx) of known on-time (ton) and off-time (toff) to the voltage regulator system (Block 200), taking measurements of the voltage regulator system in response to the one or more pulses of known on-time and off-time (Block 210), constructing a model of the output filter response of the voltage regulator system based on the measurements (Block 220) and setting one or more control loop parameters of the controller 100 based on the model of the output filter response (Block 230).

Unstable operating regions can be avoided by constructing a model of the output filter response which is based on actual system behavior, and setting the control loop parameter(s) of the controller 100 based on the model of that behavior. System identification uses statistical methods to build mathematical models of dynamic systems from measured data, in this case a voltage regulator system having an output filter response set by an output inductance (L) and capacitance (C). By applying one or more pulses of known on-time (ton) and off-time (toff) to the voltage regulator system and measuring the system response, a statistical method can be used to construct a mathematical model of the voltage regulator system from the measured data. In some embodiments, the actual double pole frequency of the output filter response is calculated based on the measurements. However, the pole locations do not necessarily have to be calculated to make use of the measurements. The difference between measured and expected values informs the parameter setting unit 106 of the transfer function of the voltage regulator system, and the parameter setting unit 106 can use this information to construct a model of the output filter response of the system. The parameter setting unit 106 can infer the actual double pole frequency of the output filter response from different types of measurements.

For example, the controller 100 can take one or more voltage measurements at a specific point in time relative to the one or more pulses of known on-time and off-time applied to the voltage regulator system. In another embodiment, the controller 100 takes one or more current measurements at a specific point in time relative to the one or more pulses of known on-time and off-time applied to the voltage regulator system. In yet another embodiment, the controller 100 takes one or more voltage measurements and one or more time measurements when the one or more voltage measurements meet a specific condition. In still another embodiment, the controller 100 takes one or more current measurements and one or more time measurements when the one or more current measurements meet a specific condition. In another embodiment, the controller 100 takes one or more voltage or current measurements and determines a peak, valley, or zero-crossing time of the one or more voltage or current measurements. In another embodiment, the controller 100 takes one or more voltage or current measurements and determines a peak amplitude of the one or more voltage or current measurements.

In each case, the parameter setting unit 106 constructs a model of the output filter response of the voltage regulator system based on the measurements and sets one or more control loop parameters of the controller 100 based on the model of the output filter response. The voltage regulator system can include any standard voltage and current sensing circuitry for measuring the output voltage $V_{out}$ and phase current(s) $i_{LN}$ of the system. In the case of a multi-phase system, the output current $i_{out}$ of the system equals the sum of the individual phase currents. In the case of a single-phase system, the output current $i_{out}$ of the system is the individual phase current.

Figure 3:
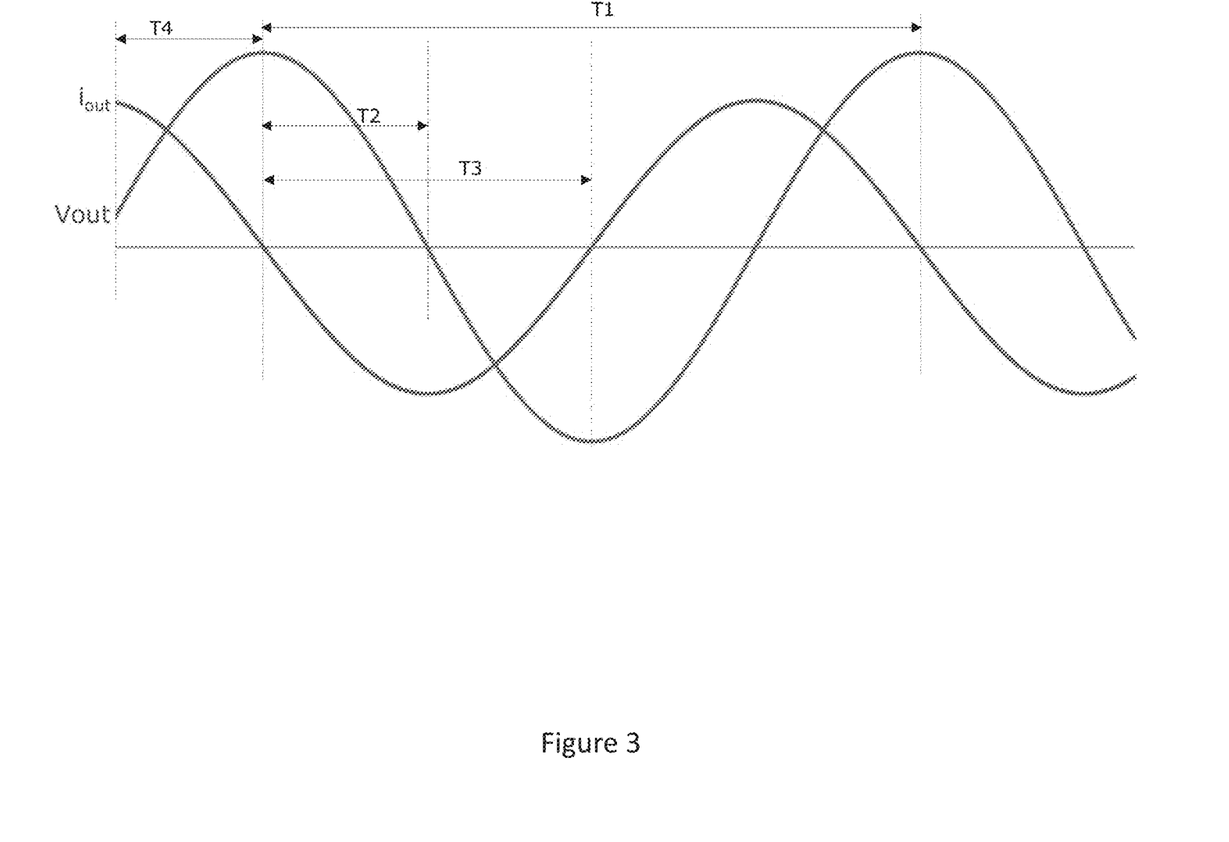
FIG. 3 illustrates various measurements used in setting control loop parameters of a voltage regulator.

FIG. 3 illustrates additional embodiments of measuring the output response of the voltage regulator system, so that a model of the system can be constructed based on the measurements. FIG. 3 shows the output current $i_{out}$ and output voltage $V_{out}$ of the voltage regulator system in response to one or more pulses of known on-time and off-time applied to the voltage regulator system.

In one embodiment, the controller 100 measures the output voltage peak-to-peak duration (T1) of the voltage regulator system in response to the one or more pulses of known on-time and off-time and the parameter setting unit 106 calculates the double pole frequency of the output response based on the measured output voltage peak-to-peak duration T1. In another embodiment, the controller 100 measures the output current zero crossing-to-zero crossing duration (T3) of the voltage regulator system in response to the one or more pulses of known on-time and off-time and the parameter setting unit 106 calculates the double pole frequency of the output response based on the measured output current zero crossing-to-zero crossing duration T3. In yet another embodiment, the controller 100 measures the output voltage peak-to-zero crossing duration (T2) of the voltage regulator system in response to the one or more pulses of known on-time and off-time and the parameter setting unit 106 calculates the double pole frequency of the output response based on the measured output voltage peak-to-zero crossing duration T2. In still another embodiment, the controller 100 measures the output current peak to output voltage peak duration (T4) of the voltage regulator system in response to the one or more pulses of known on-time and off-time and the parameter setting unit 106 calculates the double pole frequency based on the measured output current peak to output voltage peak duration T4. One or more voltage, current and time measurements can be combined by the parameter setting unit 106 to calculate the double pole frequency.

The measurement durations T1 through T4 illustrated in FIG. 3 relate to each other and the double pole frequency of the output response as follows:

$$T1 = 4 \times T2 = 4 \times T4 = 2 \times T3 = 2\pi\sqrt{LC} \qquad (1)$$

The double pole frequency of the output response of the voltage regulator is given by:

$$\frac{1}{2\pi\sqrt{LC}} = \frac{1}{T1} \qquad (2)$$

Figure 4:
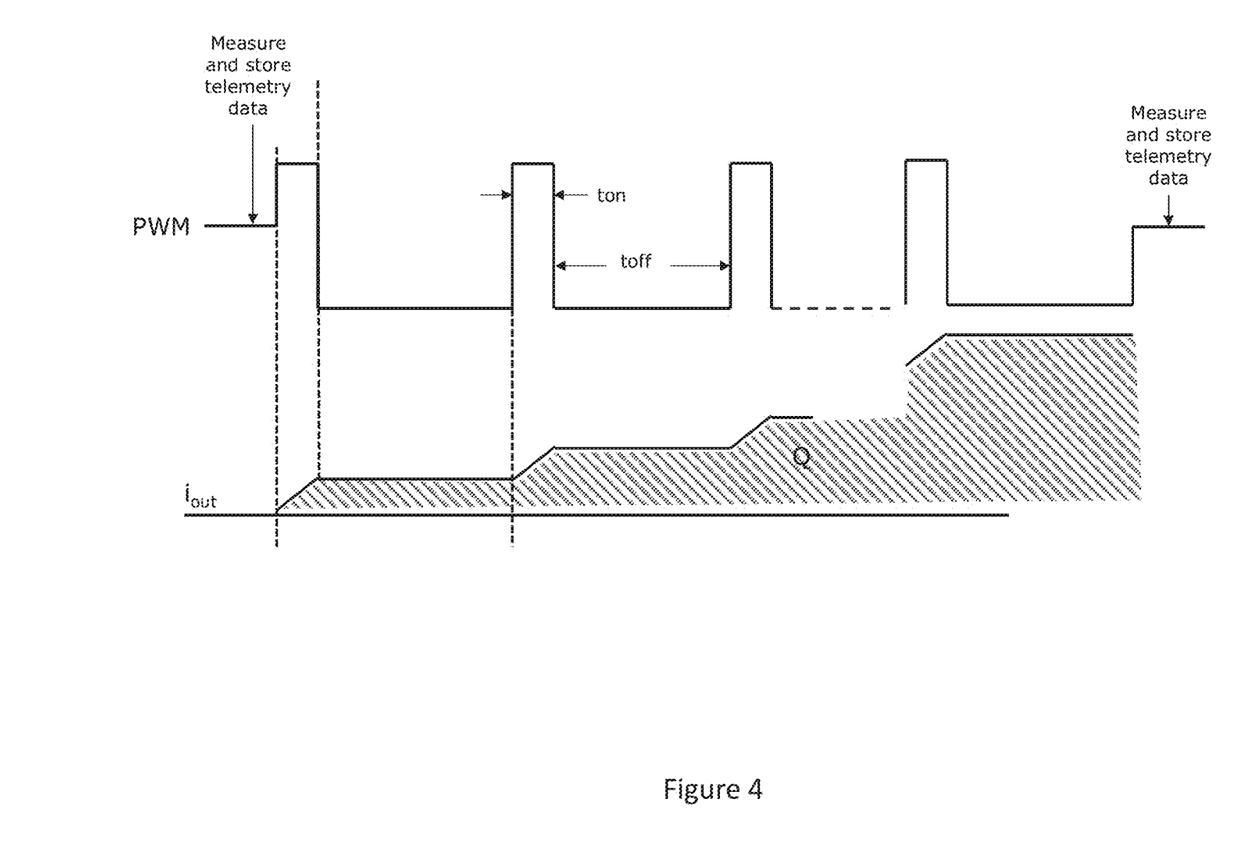
FIG. 4 illustrates various waveforms associated with a control loop parameter setting embodiment.

Calculation of the double pole frequency of the output response of the voltage regulator system is explained next in more detail with reference to FIG. 4. FIG. 4 shows the output current $i_{out}$ of the voltage regulator system and charge (Q) stored in the output capacitor Cout in response to one or more PWM (pulse width modulation) pulses of known on-time (ton) and off-time (toff) applied to the voltage regulator system. The PWM signal controls the closing of one or more switch devices 104 coupling the respective inductor Lx to the input source (Vin) or ground, so as to increase or decrease the inductor current $i_{Lx}$ based on the PWM signal. In the case of a multi-phase voltage regulator system, the double pole frequency is calculated based on measurements taken for each phase 102 of the multi-phase system in response to the one or more pulses of known on-time and off-time and the control loop parameter(s) of the controller 100 are set based on the double pole frequency calculated for each phase 102 of the multi-phase system.

The duration of the pulse(s) can be adjusted based on the nominal or expected output inductance (L) and capacitance (C) values for the voltage regulator system. The pulse(s) should not be too long or too short. For example, if the pulse(s) are too short, the voltage change is very small and the measurement error will be high. For larger inductors, less current is injected to the output capacitor Cout. For larger capacitors, more current injection, for a longer duration, is needed to charge the output capacitor Cout and change the output voltage. The pulse duration can be chosen in a way to optimize the current and voltage such that the change is large enough for sufficient accuracy in the measurements, but small enough so that the change in voltage and current stay within an expected range and do not significantly affect the startup of the system.

In general, telemetry data such as output voltage $V_{out}$, output current $i_{out}$, etc. is measured and stored in memory 108 of the controller 100 before the first PWM pulse is applied, and measured and stored in the memory 108 again after the last PWM pulse is applied, as indicated in FIG. 4. The parameter setting unit 106 uses the stored telemetry data to calculate the double pole frequency of the output response.

In one embodiment, the parameter setting unit 106 calculates a lumped LC value based on the stored telemetry data as given by:

$$LC \approx \frac{0.5 * Vin(t_{on} * n + t_{off} * (1+n) * n + t_{on} * n^2)}{(V2 - V1)} + \frac{n-1}{2} * t_{off}^2 \qquad (3)$$

where n is the number of PWM pulses of known on-time (ton) and off-time (toff) applied to the voltage regulator system, Vin is the input voltage of the voltage regulator system, V1 is a first output voltage measurement taken before the first pulse of known on-time is applied to the voltage regulator system, and V2 is a second output voltage measurement taken after the last pulse of known on-time is applied to the voltage regulator system. In one embodiment, only a single pulse of known on-time is applied to the voltage regulator system. According to this embodiment, the first output voltage measurement V1 is taken before the single pulse of known on-time is applied to the voltage regulator system and the second output voltage measurement V2 is taken after the single pulse of known on-time is applied to the voltage regulator system.

The parameter setting unit 106 calculates the double pole frequency of the output response of the voltage regulator system based on the calculated LC value as given by:

$$\frac{1}{2\pi\sqrt{LC}} \qquad (4)$$

In another embodiment, the parameter setting unit 106 calculates the double pole frequency of the output response of the voltage regulator system based on an amount of energy E(Q) transferred to the inductance L and output capacitor Cout in response to the one or more pulses of known on-time and off-time. The amount of energy E(Q) transferred to the output capacitor Cout is a function of the charge transferred (Q) and the relationship between the inductor current and capacitance voltage set by conservation of energy, as given by:

$$C \cdot V^2 = L \cdot I^2 + C \cdot V_o^2 \qquad (5)$$

where Vo is a pre-bias voltage of the output capacitor Cout. The amount of energy (Q) transferred to the output capacitor Cout is a function of 1/L, Vin, ton, toff and the number of pulses (n) of known on-time and off-time applied to the voltage regulator system, and can be expressed as follows:

$$V_{peak} = \sqrt{\frac{L \cdot I_{peak}^2 + C \cdot V_o^2}{C}} \qquad (6)$$

$$V_{peak} = \sqrt{\frac{L}{C} \cdot I_{peak}^2 + C \cdot V_o^2} \qquad (7)$$

$$I_{peak} = \frac{V_{in} - V_o}{L} \cdot T_{on} \qquad (8)$$

$$V_{peak} = \sqrt{\frac{L}{C} \cdot \left(\frac{V_{in} - V_o}{L} \cdot T_{on}\right)^2 + V_o^2} \qquad (9)$$

$$V_{peak}^2 - V_o^2 = (V_{in} - V_o) \cdot \frac{T_{on}}{LC} \qquad (10)$$

where Vpeak is the measured peak output voltage and Ipeak is the measured peak output current (see FIG. 3 for examples of peak output voltage and current measurements). The parameter setting unit 106 calculates the double pole frequency $$\frac{1}{2\pi\sqrt{LC}}$$

of the output response of the voltage regulator system based on the calculated amount of energy (Q) transferred to the output capacitor Cout, e.g. in accordance with any one of equations (5) through (10).

After constructing a model of the output filter response of the voltage regulator system based on the measurements taken by the controller 100, the parameter setting unit 106 sets one or more control loop parameters of the controller 100 based on the model of the output filter response.

Figure 5:
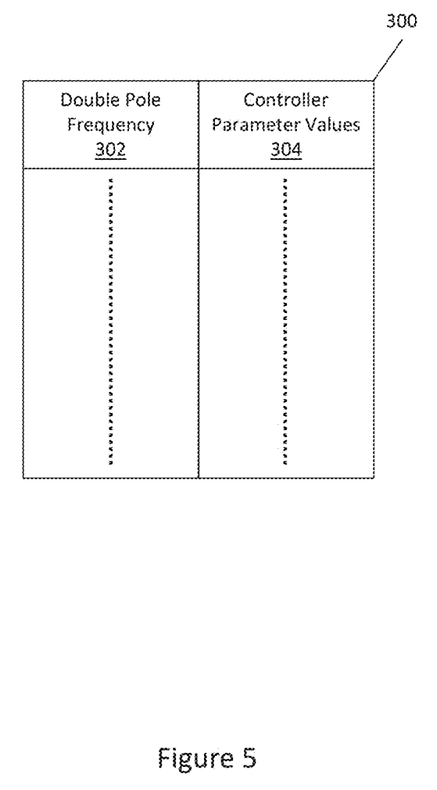
FIG. 5 illustrates a block diagram of a lookup table-based embodiment for setting control loop parameters of a voltage regulator.

FIG. 5 illustrates an embodiment of using the calculated double pole frequency as a lookup value to identify one or more corresponding control loop parameters. The controller 100 includes memory 108 for storing a lookup table 300 of control loop parameter values. The lookup table 300 includes double pole frequency values 302 and one or more control loop parameter values 304 associated with each stored double pole frequency value 302. The parameter setting unit 106 sets one or more control loop parameters of the controller 100 by using the calculated double pole frequency as a lookup value in the table 300 of stored controller parameter values. The parameter setting unit 106 selects the stored controller parameter value(s) 304 most closely associated with the lookup value as new control loop parameter(s) of the controller 100.

In another embodiment, one or more baseline (nominal) control loop parameters of the controller 100 are set based on a baseline (nominal) LC double pole frequency for the voltage regulator system. The baseline LC double pole frequency can be selected based on an expected or nominal output inductance (L) and capacitance (C) of the voltage regulator system. The parameter setting unit 106 adjusts the one or more baseline control loop parameters in accordance with the double pole frequency of the output filter response as calculated based on the measurements taken in response to the one or more pulses of known on-time and off-time applied to the voltage regulator system.

Any type of voltage regulator controller having one or more control loop parameters can be used. In one embodiment, the controller 100 is a PID (proportional-integral-derivative) controller. One or more PID parameters of the controller 100 can be set by moving a zero location of the controller 100 to match an absolute change of the double pole frequency, as indicated by the difference between a baseline (nominal) double pole frequency and the double pole frequency calculated based on the measurements. For example, $f_0$ is the baseline (nominal) double pole frequency, $Kp_0$, $Ki_0$ and $Kd_0$ are baseline PID parameters, and $f_M$ is the actual double pole frequency of the voltage regulator system as modeled by any of the techniques previously described herein. The parameter setting unit 106 adjusts (tunes) two zeros in the PID transfer function based on the modeled double pole frequency $f_M$ as given by:

$$Kp_x = Kp_0 \quad (11)$$

$$Ki_x = Ki_0 + 2\pi \times (f_M - f_0) \times Kp_0 \quad (12)$$

$$Kd_x = Kd_0\left(1 - \frac{f_M - f_0}{f_0}\right) \quad (13)$$

where $Kp_x$, $Ki_x$ and $Kd_x$ are the new PID parameters calculated based on the modeled double pole frequency $f_M$.

In another embodiment, a zero location of the PID-based controller 100 is moved to match a relative change of the double pole frequency, as indicated by the difference between the baseline double pole frequency and the double pole frequency calculated based on the measurements. For example, $f_0$ again is the baseline (nominal) double pole frequency, $Kp_0$, $Ki_0$ and $Kd_0$ are the baseline PID parameters, and the double pole frequency $f_M$ is measured by any of the techniques previously described herein. The programmable gain scaling parameters $K_{Ap}$ $K_{Ai}$ $K_{Ad}$ of the PID-based controller 100 are calculated as follows:

$$Kp_x = Kp_0\left(1 + K_{Ap} \times \frac{f_M - f_0}{f_0}\right) \quad (14)$$

-continued $$Ki_x = Ki_0\left(1 + K_{Ai} \times \frac{f_M - f_0}{f_0}\right)\left(1 + K_{Ap} \times \frac{f_M - f_0}{f_0}\right) \quad (15)$$

$$Kd_x = Kd_0 \frac{\left(1 + K_{Ap} \times \frac{f_M - f_0}{f_0}\right)}{\left(1 + K_{Ad} \times \frac{f_M - f_0}{f_0}\right)} \quad (16)$$

In both the relative and absolute PID-based embodiments, the output filter response of the voltage regulator system is tuned to the actual output inductance (L) and capacitance (C) of the voltage regulator system instead of nominal or expected L and C values.

The pulse(s) of known on-time and off-time applied to the voltage regulator system for eliciting a response, and the corresponding measurements taken to model the response can be carried out in a pre-regulation mode in which the controller 100 sets pulse on and off times independent of voltage feedback i.e. open-loop control. After the model of the output filter response is constructed and the control loop parameter(s) of the controller 100 are set based on the modeled output filter response, the controller 100 exits the pre-regulation mode and enters a regulation mode. In the regulation mode, the controller 100 provides closed loop control of pulses for controlling the switch devices 104 of the voltage regulator system, in accordance with the one or more control loop parameters set based on the modeled output filter response, so as to regulate the output voltage $V_{out}$ provided to the load (not shown) of the voltage regulator system.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of configuring a controller for a voltage regulator system having an output filter response set by an inductance (L) and a capacitance (C), the method comprising:

applying one or more pulses of known on-time and off-time to the voltage regulator system;

taking measurements of the voltage regulator system in response to the one or more pulses of known on-time and off-time;

constructing a model of the output filter response of the voltage regulator system, wherein the constructing comprises calculating a double pole frequency of the output filter response based on the measurements; and setting one or more control loop parameters of the controller based on the model of the output filter response.

2. The method of claim 1, wherein calculating the double pole frequency of the output filter response based on the measurements comprises:
combining one or more voltage, current and time measurements to calculate the double pole frequency.

3. The method of claim 1, wherein setting one or more control loop parameters of the controller based on the model of the output filter response comprises:
setting one or more baseline control loop parameters of the controller based on a baseline LC double pole frequency; and
adjusting the one or more baseline control loop parameters based on the double pole frequency of the output filter response calculated based on the measurements.

4. The method of claim 1, wherein calculating the double pole frequency of the output filter response based on the measurements comprises:
calculating an LC value based on the number of pulses of known on-time and off-time applied to the voltage regulator system, the known on-time and off-time of the one or more pulses, an input voltage of the voltage regulator system, a first output voltage measurement taken before the first pulse of known on-time is applied to the voltage regulator system, and a second output voltage measurement taken after the last pulse of known on-time is applied to the voltage regulator system; and
calculating the double pole frequency of the voltage regulator system based on the calculated LC value.

5. The method of claim 4, wherein a single pulse of known on-time is applied to the voltage regulator system, wherein the first output voltage measurement is taken before the single pulse of known on-time is applied to the voltage regulator system, and wherein the second output voltage measurement is taken after the single pulse of known on-time is applied to the voltage regulator system.

6. The method of claim 1, wherein output voltage peak-to-peak duration of the voltage regulator system is measured in response to the one or more pulses of known on-time and off-time, and wherein calculating the double pole frequency of the output filter response based on the measurements comprises:
calculating the double pole frequency based on the measured output voltage peak-to-peak duration.

7. The method of claim 1, wherein output current zero crossing-to-zero crossing duration of the voltage regulator system is measured in response to the one or more pulses of known on-time and off-time, and wherein calculating the double pole frequency of the output filter response based on the measurements comprises:
calculating the double pole frequency based on the measured output current zero crossing-to-zero crossing duration.

8. The method of claim 1, wherein output voltage peak-to-zero crossing duration of the voltage regulator system is measured in response to the one or more pulses of known on-time and off-time, and wherein calculating the double pole frequency of the output filter response based on the measurements comprises:
calculating the double pole frequency based on the measured output voltage peak-to-zero crossing duration.

9. The method of claim 1, wherein output current peak to output voltage peak duration of the voltage regulator system is measured in response to the one or more pulses of known on-time and off-time, and wherein calculating the double pole frequency of the output filter response based on the measurements comprises:
calculating the double pole frequency based on the measured output current peak to output voltage peak duration.

10. The method of claim 1, wherein setting one or more control loop parameters of the controller based on the model of the output filter response comprises:
using the double pole frequency calculated based on the measurements as a lookup value in a table of stored controller parameter values; and
selecting one or more of the stored controller parameter values most closely associated with the lookup value as new one or more control loop parameters of the controller.

11. The method of claim 1, wherein the controller is a PID (proportional-integral-derivative) controller and wherein setting one or more control loop parameters of the controller based on the model of the output filter response comprises:
moving a zero location of the PID controller to match an absolute change of the double pole frequency, as indicated by the difference between a baseline double pole frequency and the double pole frequency calculated based on the measurements.

12. The method of claim 1, wherein the controller is a PID (proportional-integral-derivative) controller and wherein setting one or more control loop parameters of the controller based on the model of the output filter response comprises:
moving a zero location of the PID controller to match a relative change of the double pole frequency, as indicated by the difference between a baseline double pole frequency and the double pole frequency calculated based on the measurements.

13. The method of claim 1, wherein the voltage regulator system is a multi-phase system, wherein the double pole frequency is calculated based on measurements taken for each phase of the multi-phase system in response to the one or more pulses of known on-time and off-time, and wherein the one or more control loop parameters of the controller are set based on the double pole frequency calculated for each phase of the multi-phase system.

14. The method of claim 1, wherein calculating the double pole frequency of the output filter response based on the measurements comprises:
calculating an amount of energy transferred to an output capacitor of the voltage regulator system in response to the one or more pulses of known on-time and off-time; and
calculating the double pole frequency based on the calculated amount of energy transferred to the output capacitor.

15. The method of claim 1, wherein taking measurements of the voltage regulator system in response to the one or more pulses of known on-time and off-time comprises:
taking one or more voltage measurements at a specific point in time relative to the one or more pulses of known on-time and off-time.

16. The method of claim 1, wherein taking measurements of the voltage regulator system in response to the one or more pulses of known on-time and off-time comprises:
taking one or more current measurements at a specific point in time relative to the one or more pulses of known on-time and off-time.

17. The method of claim 1, wherein taking measurements of the voltage regulator system in response to the one or more pulses of known on-time and off-time comprises:

taking one or more voltage measurements and one or more time measurements when the one or more voltage measurements meet a specific condition.

18. The method of claim 1, wherein taking measurements of the voltage regulator system in response to the one or more pulses of known on-time and off-time comprises:
taking one or more current measurements and one or more time measurements when the one or more current measurements meet a specific condition.

19. The method of claim 1, wherein taking measurements of the voltage regulator system in response to the one or more pulses of known on-time and off-time comprises:
taking one or more voltage or current measurements; and
determining a peak, valley, or zero-crossing time of the one or more voltage or current measurements.

20. The method of claim 1, wherein taking measurements of the voltage regulator system in response to the one or more pulses of known on-time and off-time comprises:
taking one or more voltage or current measurements; and
determining a peak amplitude of the one or more voltage or current measurements.

21. The method of claim 1, wherein the one or more pulses of known on-time and off-time are applied and the measurements are taken in a pre-regulation mode in which the controller sets pulse on and off times independent of voltage feedback.

22. The method of claim 21, further comprising:
exiting the pre-regulation mode and entering a regulation mode in which the controller provides closed loop control of pulses for controlling one or more switch devices of the voltage regulator system, in accordance with the one or more control loop parameters set based on the model of the output filter response.

23. The method of claim 1, further comprising:
adjusting the duration of the one or more pulses of known on-time and off-time based on the inductance and the capacitance which set the output filter response of the voltage regulator system.

24. A voltage regulator system having an output filter response set by an inductance (L) and a capacitance (C), comprising a controller operable to apply one or more pulses of known on-time and off-time to the voltage regulator system, take measurements of the voltage regulator system in response to the one or more pulses of known on-time and off-time, construct a model of the output filter response of the voltage regulator system, wherein the model construction comprises calculating a double pole frequency of the output filter response based on the measurements, and set one or more control loop parameters of the controller based on the model of the output filter response.

25. A method of configuring a controller for a voltage regulator system having an output filter response set by an inductance (L) and a capacitance (C), the method comprising:
applying, during a pre-regulation mode in which the controller sets pulse on and off times independent of voltage feedback, one or more pulses of known on-time and off-time to the voltage regulator system;
taking, during the pre-regulation mode, measurements of the voltage regulator system in response to the one or more pulses of known on-time and off-time;
constructing a model of the output filter response of the voltage regulator system based on the measurements;
setting one or more control loop parameters of the controller based on the model of the output filter response; and
exiting the pre-regulation mode and entering a regulation mode in which the controller provides closed loop control of pulses for controlling one or more switch devices of the voltage regulator system, in accordance with the one or more control loop parameters set based on the model of the output filter response.

26. A voltage regulator system having an output filter response set by an inductance (L) and a capacitance (C), comprising a controller operable to:
apply, during a pre-regulation mode in which the controller sets pulse on and off times independent of voltage feedback, one or more pulses of known on-time and off-time to the voltage regulator system;
take, during the pre-regulation mode, measurements of the voltage regulator system in response to the one or more pulses of known on-time and off-time;
construct a model of the output filter response of the voltage regulator system based on the measurements;
set one or more control loop parameters of the controller based on the model of the output filter response; and
exit the pre-regulation mode and enter a regulation mode in which the controller provides closed loop control of pulses for controlling one or more switch devices of the voltage regulator system, in accordance with the one or more control loop parameters set based on the model of the output filter response.

* * * * *